(12) United States Patent
Fujita et al.

(10) Patent No.: US 12,113,010 B2
(45) Date of Patent: Oct. 8, 2024

(54) PLURALITY OF BUS BARS INTERSECTING A PLURALITY ELECTRODE

(71) Applicant: Mitsubishi Electric Corporation, Tokyo (JP)

(72) Inventors: Shigeto Fujita, Tokyo (JP); Tetsuya Matsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 383 days.

(21) Appl. No.: 17/754,238

(22) PCT Filed: Nov. 15, 2019

(86) PCT No.: PCT/JP2019/044893
§ 371 (c)(1),
(2) Date: Mar. 28, 2022

(87) PCT Pub. No.: WO2021/095239
PCT Pub. Date: May 20, 2021

(65) Prior Publication Data
US 2022/0375846 A1 Nov. 24, 2022

(51) Int. Cl.
*H01L 23/50* (2006.01)
*H01L 21/56* (2006.01)
(Continued)

(52) U.S. Cl.
CPC .............. *H01L 23/50* (2013.01); *H01L 21/56* (2013.01); *H01L 23/3107* (2013.01);
(Continued)

(58) Field of Classification Search
CPC ............. H01L 2924/181; H01L 25/072; H01L 25/0753; H01L 25/0652; H01L 23/50;
(Continued)

(56) References Cited

U.S. PATENT DOCUMENTS

| 6,380,622 | B1 | 4/2002 | Hirai et al. |
| 2013/0221516 | A1* | 8/2013 | Asada ............... H01L 23/49524 257/735 |

(Continued)

FOREIGN PATENT DOCUMENTS

| JP | 2001-144250 A | 5/2001 |
| JP | 2008-113025 A | 5/2008 |
| JP | 2010-161131 A | 7/2010 |

OTHER PUBLICATIONS

International Search Report issued in PCT/JP2019/044893; mailed Feb. 10, 2020.

*Primary Examiner* — Alonzo Chambliss
(74) *Attorney, Agent, or Firm* — Studebaker & Brackett PC

(57) ABSTRACT

A semiconductor device includes a plurality of semiconductor chips, an insulating part, a first electrode, a second electrode, a first bus bar, and a second bus bar. The insulating part surrounds the semiconductor chips. The first electrode is in pressure contact with the semiconductor chips. The semiconductor chips are sandwiched between the first electrode and the second electrode in a first direction. The second electrode is in pressure contact with the semiconductor chips. The first bus bar is connected to the first electrode. The second bus bar is connected to the second electrode. The first bus bar and the second bus bar sandwich the insulating part in a second direction intersecting the first direction.

7 Claims, 19 Drawing Sheets

(51) Int. Cl.
  *H01L 23/00*     (2006.01)
  *H01L 23/31*     (2006.01)
  *H01L 25/065*    (2023.01)
  *H01L 25/07*     (2006.01)
  *H01L 25/075*    (2006.01)

(52) U.S. Cl.
  CPC .............. *H01L 24/37* (2013.01); *H01L 24/40* (2013.01); *H01L 24/83* (2013.01); *H01L 24/97* (2013.01); *H01L 25/0652* (2013.01); *H01L 25/072* (2013.01); *H01L 25/0753* (2013.01); *H01L 2924/181* (2013.01)

(58) Field of Classification Search
  CPC ..... H01L 23/3107; H01L 21/56; H01L 24/97; H01L 24/40; H01L 24/83; H01L 24/37
  See application file for complete search history.

(56) References Cited

U.S. PATENT DOCUMENTS

2015/0243638 A1* 8/2015 Matsuoka .............. H01L 25/50
                                                                257/774
2019/0189537 A1* 6/2019 Fujino .................... H01L 23/48
2022/0181221 A1* 6/2022 Yokoyama ............. H01L 23/13

* cited by examiner

PLURALITY OF BUS BARS INTERSECTING A PLURALITY ELECTRODE

TECHNICAL FIELD

The present invention relates to a semiconductor device.

BACKGROUND ART

Conventionally, there is a semiconductor device including a plurality of semiconductor chips, a pair of electrodes in pressure contact with both surfaces of each of the semiconductor chips, and a pair of bus bars connected to the pair of electrodes. When current flowing in a direction opposite to current flowing through the other electrode flows through one electrode, electromagnetic repulsion is produced in each of the pair of electrodes. The direction of the electromagnetic repulsion produced in each of the pair of electrodes is the same direction as the direction in which each of the pair of electrodes goes away from the semiconductor chips. For example, in a semiconductor device described in Japanese Patent Laying-Open No. 2008-113025 (PTL 1), one of bus bars is opposed to the other bus bar with a pair of electrodes and semiconductor chips interposed therebetween. Thus, electromagnetic repulsion is produced in each of the pair of bus bars when current flowing in a direction opposite to current flowing through the other bus bar flows through one bus bar. The direction of the electromagnetic repulsion produced in each of the pair of bus bars is the same direction as the direction in which each of the pair of bus bars goes away from the semiconductor chips.

CITATION LIST

Patent Literature

PTL 1: Japanese Patent Laying-Open No. 2008-113025

SUMMARY OF INVENTION

Technical Problem

In the semiconductor device described in the publication above, each of a pair of bus bars is connected so as to overlap with one of the pair of electrodes. Therefore, the direction in which each of the pair of electrodes goes away from the semiconductor chips is the same direction as the direction in which each of the pair of bus bars goes away from the semiconductor chips. Thus, when electromagnetic repulsion is produced in a pair of electrodes and a pair of bus bars, force acts on each of the pair of electrodes in a direction away from the semiconductor chips due to the electromagnetic repulsion produced in each of the pair of bus bars and the electromagnetic repulsion produced in each of the pair of electrodes. Each of the pair of electrodes is in pressure contact with the semiconductor chips and not fixed to the semiconductor chips. Therefore, each of a pair of electrodes may separate from the semiconductor chips when a large electromagnetic repulsion is produced due to a short-circuit of the semiconductor chip and thus abrupt current flowing through the semiconductor chip.

The present invention is made in view of the problem above and an object of the present invention is to provide a semiconductor device in which separation of a pair of electrodes in pressure contact with semiconductor chips from the semiconductor chips is suppressed.

Solution to Problem

A semiconductor device according to the present invention includes a plurality of semiconductor chips, an insulating part, a first electrode, a second electrode, a first bus bar, and a second bus bar. The insulating part surrounds the semiconductor chips. The first electrode is in pressure contact with the semiconductor chips. The semiconductor chips are sandwiched between the first electrode and the second electrode in a first direction. The second electrode is in pressure contact with the semiconductor chips. The first bus bar is connected to the first electrode. The second bus bar is connected to the second electrode. The first bus bar and the second bus bar sandwich the insulating part in a second direction intersecting the first direction.

Advantageous Effects of Invention

In the semiconductor device according to the present invention, the semiconductor chips are sandwiched between the first electrode and the second electrode in a first direction. The first bus bar and the second bus bar sandwich the insulating part in a second direction intersecting the first direction. The direction of electromagnetic repulsion produced in the first bus bar and the second bus bar is therefore a direction different from the direction in which the first electrode and the second electrode go away from the semiconductor chips. Accordingly, separation of the first electrode and the second electrode in pressure contact with the semiconductor chips from the semiconductor chips can be suppressed.

DESCRIPTION OF EMBODIMENTS

Embodiments will be described below with reference to the drawings. In the following, like or corresponding parts are denoted by like reference signs and an overlapping description will not be repeated.

First Embodiment

<Configuration of Semiconductor Device 100>

Figure 1:
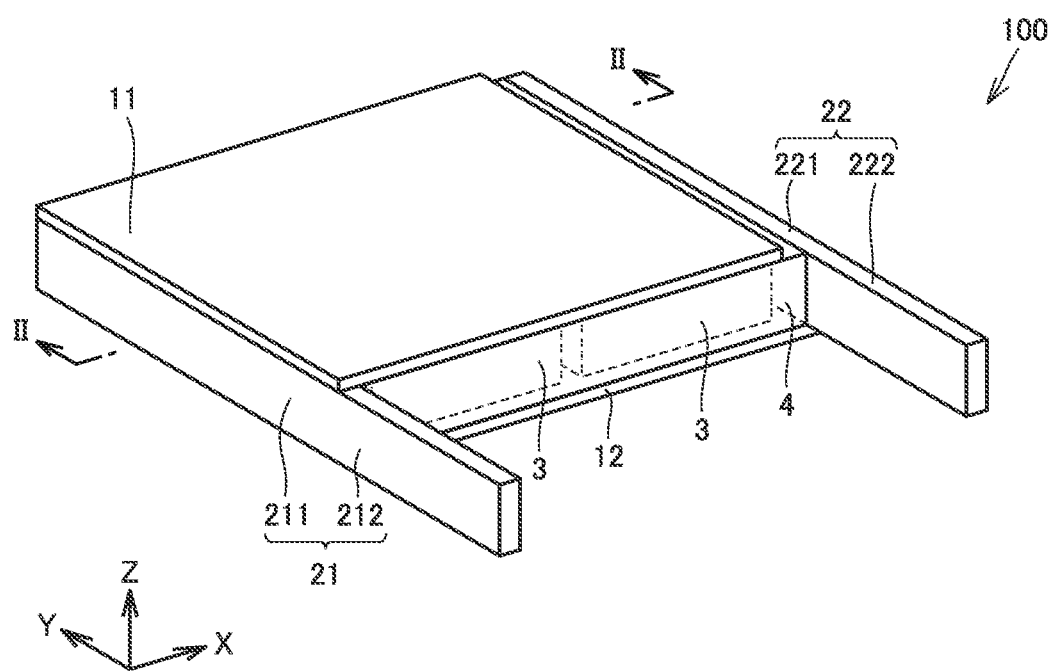
FIG. 1 is a perspective view schematically showing a configuration of a semiconductor device according to a first embodiment.
Figure 2:
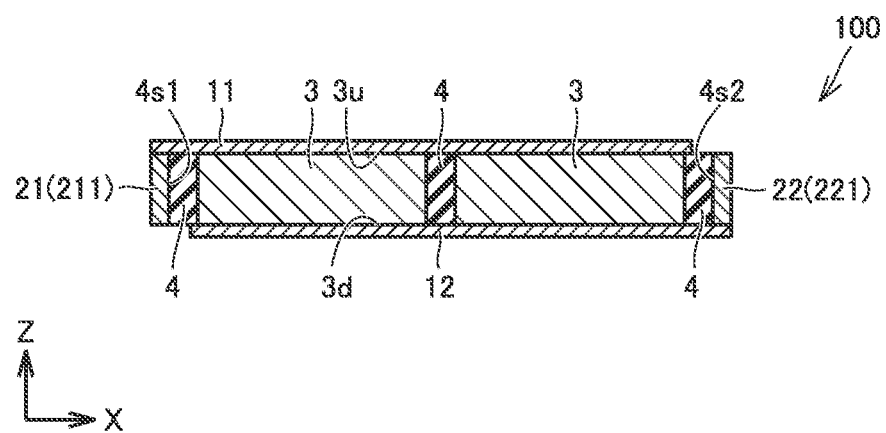
FIG. 2 is a cross-sectional view along line 11-11 in FIG. 1.

Referring to FIG. 1 and FIG. 2, a configuration of a semiconductor device 100 according to a first embodiment will be described. FIG. 1 is a perspective view schematically showing a configuration of semiconductor device 100 according to the first embodiment. FIG. 2 is a cross-sectional view along line II-II in FIG. 1.

As shown in FIG. 1, semiconductor device 100 includes a plurality of semiconductor chips 3, an insulating part 4, a first electrode 11, a second electrode 12, a first bus bar 21, and a second bus bar 22. Semiconductor device 100 is a power semiconductor device for electric power. Semiconductor device 100 is used with a large voltage, for example, in power systems. The voltage applied to semiconductor device 100 may be, for example, 500 kV at most or larger. Semiconductor device 100 may be applied to a modular multilevel converter (MMC). When semiconductor device 100 is applied to a modular multilevel converter, a plurality of semiconductor devices 100 stacked in the vertical direction may be used.

As shown in FIG. 2, a plurality of semiconductor chips 3 are arranged between first electrode 11 and second electrode 12. The dimension in the vertical direction of each of semiconductor chips 3 is equal. Each of the semiconductor chips includes a first surface 3u and a second surface 3d. The height position of first surface 3u of each of semiconductor chips 3 is equal. The height position of second surface 3d of each of semiconductor chips 3 is equal.

Semiconductor chips 3 are connected in parallel. Each of semiconductor chips 3 is, for example, a power semiconductor chip for electric power. When each of semiconductor chips 3 is a power semiconductor chip, large current may be fed through semiconductor device 100.

Each of semiconductor chips 3 is, for example, a semiconductor chip for electric power, such as an insulated gate bipolar transistor (IGBT) chip or a diode chip. The diode chip may be a freewheel diode. When semiconductor chip 3 is a freewheel diode, the direction in which current flows is the direction opposite to that of a diode other than a freewheel diode.

As shown in FIG. 1, insulating part 4 surrounds semiconductor chips 3. Insulating part 4 surrounds each of semiconductor chips 3 to isolate semiconductor chips 3 from each other. The dimension in the thickness direction of insulating part 4 is equal to the dimension in the thickness direction of semiconductor chips 3.

As shown in FIG. 1, insulating part 4 is formed such that first bus bar 21 and second bus bar 22 can be fixed. As shown in FIG. 2, insulating part 4 has a first side surface portion 4s1 and a second side surface portion 4s2. Second side surface portion 4s2 is opposed to first side surface portion 4s1. Second side surface portion 4s2 is provided in parallel with first side surface portion 4s1. First bus bar 21 is fixed to first side surface portion 4s1. Second bus bar 22 is fixed to second side surface portion 4s2.

As shown in FIG. 1, first electrode 11 is in pressure contact with semiconductor chips 3. Semiconductor chips 3 are sandwiched between second electrode 12 and first electrode 11 in a first direction. Second electrode 12 is in pressure contact with semiconductor chips 3.

First electrode 11 and second electrode 12 are electrically connected by semiconductor chips 3. First electrode 11 is a current-applying electrode. Second electrode 12 is a current-outgoing electrode. Current therefore flows from first electrode 11 toward second electrode 12 through semiconductor chips 3.

As shown in FIG. 2, first electrode 11 is in pressure contact with first surface 3u of each of semiconductor chips 3. Second electrode 12 is in pressure contact with second surface 3d of each of semiconductor chips 3. First electrode 11, second electrode 12, and a plurality of semiconductor chips 3 are formed as a stack structure. In the present embodiment, the stack structure refers to a structure in which first electrode 11, semiconductor chips 3, and second electrode 12 are stacked in the order of first electrode 11, semiconductor chips 3, and second electrode 12. In the present embodiment, stack force refers to a force for bringing first electrode 11 and second electrode 12 into pressure contact with semiconductor chips 3.

First electrode 11 and second electrode 12 are in pressure contact with semiconductor chips 3 and therefore not fixed to semiconductor chips 3. Thus, first electrode 11 and second electrode 12 are movable along the first direction (Z axis direction) relative to semiconductor chips 3. First electrode 11 and second electrode 12 are not fixed to semiconductor chips 3, for example, by solder.

A not-shown conductive member and a spring deformable in the vertical direction may be arranged between first electrode 11 and semiconductor chips 3 and between second electrode 12 and semiconductor chips 3. Thus, even when the dimension in the vertical direction of each of semiconductor chips 3 has a deviation, first electrode 11 and second electrode 12 can be brought into pressure contact with semiconductor chips 3 with a proper pressure.

A not-shown conductive member and a spring deformable in the vertical direction may be arranged on first electrode 11 on the side opposite to semiconductor chips 3, and a not-shown conductive member and a spring deformable in the vertical direction may be arranged on second electrode 12 on the side opposite to semiconductor chips 3. Thus, when a pressure is applied in the vertical direction after a plurality of semiconductor devices 100 are arranged so as to be stacked in the vertical direction, semiconductor devices 100 can be electrically connected by a proper pressure on semiconductor chips 3. Thus, a plurality of semiconductor devices 100 can be easily arranged.

As shown in FIG. 1, first bus bar 21 is electrically connected to first electrode 11. The first bus bar is electrically connected to first electrode 11 by a not-shown conductor. Second bus bar 22 is electrically connected to second electrode 12. The second bus bar is electrically connected to second electrode 12 by a not-shown conductor. First bus bar 21 and second bus bar 22 sandwich insulating part 4 in a second direction (X-axis direction). The second direction (X-axis direction) intersects the first direction (Z-axis direction).

As shown in FIG. 1, in the present embodiment, the direction in which first bus bar 21 and second bus bar 22 sandwich insulating part 4 is orthogonal to the direction in which first electrode 11 and second electrode 12 sandwich semiconductor chips 3. The second direction (X-axis direction) is therefore orthogonal to the first direction (Z-axis direction). First bus bar 21 is opposed to second bus bar 22 such that semiconductor chips 3 are sandwiched between first bus bar 21 and second bus bar 22.

As shown in FIG. 1, first bus bar 21 includes a first connection portion 211 and a first extension portion 212. First connection portion 211 is connected to first electrode 11. First extension portion 212 extends from first connection portion 211. Second connection portion 221 is connected to second electrode 12. A second extension portion 222 extends from second connection portion 221.

Second connection portion 221 and first connection portion 211 are opposed to each other with insulating part 4 interposed therebetween. The direction in which first extension portion 212 extends may be the same direction as or may be the direction opposite to the direction in which second extension portion 222 extends.

First bus bar 21 and second bus bar 22 are electrical conductors. Current is applied to semiconductor chips 3 through first bus bar 21. Current flows out of semiconductor chips 3 through second bus bar 22. First bus bar 21 and second bus bar 22 are connected to a not-shown external device.

As shown in FIG. 1, in the present embodiment, the first direction is defined as the Z-axis direction. The second direction is defined as the X-axis direction. The direction orthogonal to the first direction and the second direction is defined as the Y-axis direction. First extension portion 212 extends from first connection portion 211 along the Y-axis direction. In the X-axis direction, the direction from first bus bar 21 toward second bus bar 22 is the X-axis positive direction. In the Y-axis direction, the direction from first extension portion 212 toward first connection portion 211 is the Y-axis positive direction. In the Z-axis direction, the direction from second electrode 12 toward first electrode 11 is the Z-axis positive direction. The negative direction of each axis is the direction opposite to the positive direction of the axis.

<Current Flowing Through Semiconductor Device 100 and Electromagnetic Repulsion Produced by Current>

Figure 3:
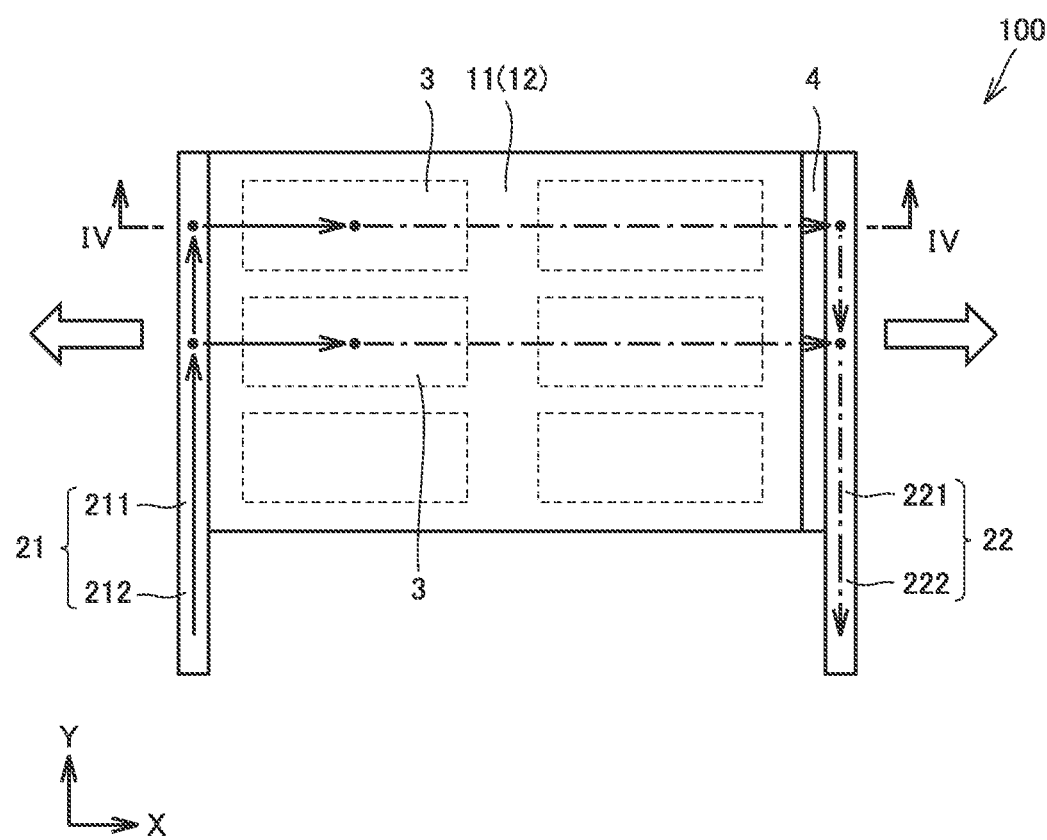
FIG. 3 is a top view schematically showing current flowing through the semiconductor device according to the first embodiment.
Figure 4:
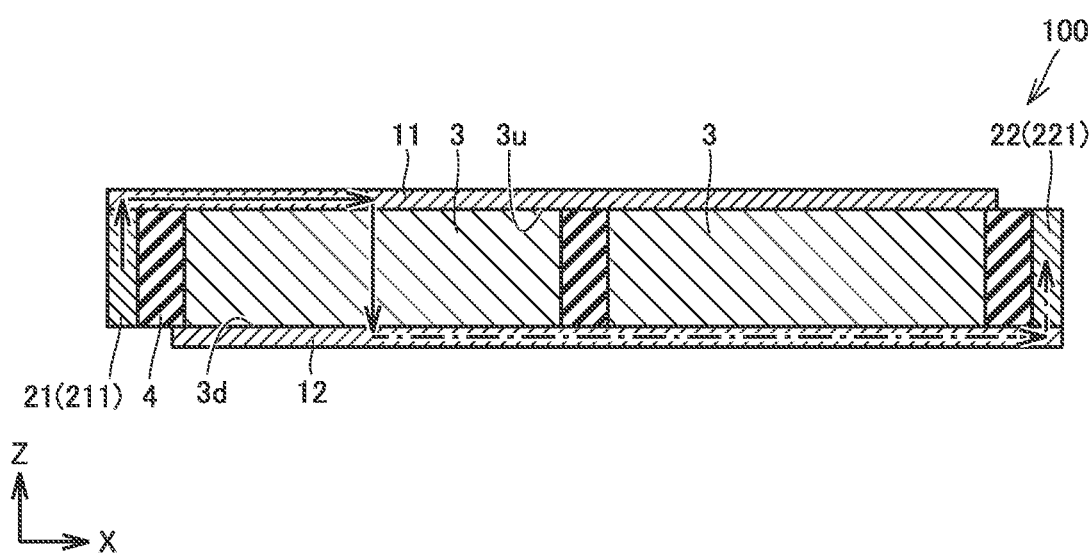
FIG. 4 is a cross-sectional view schematically showing current flowing through the semiconductor device according to the first embodiment.

Referring now to FIG. 3 and FIG. 4, current flowing through semiconductor device 100 according to the first embodiment and electromagnetic repulsion produced in semiconductor device 100 in a normal state of semiconductor device 100 will be described. FIG. 3 is a top view schematically showing current flowing through semiconductor device 100 according to the first embodiment. FIG. 4 is a cross-sectional view along line IV-IV in FIG. 3. FIG. 4 schematically shows current flowing through semiconductor device 100 according to the first embodiment. In a normal state of semiconductor device 100, all of semiconductor chips 3 operate normally. Semiconductor chips 3 do not include a short-circuited semiconductor chip 3.

FIG. 3 and FIG. 4 illustrate the direction in which current flows in a normal state of semiconductor device 100. The solid arrows show the direction in which incoming current flows. In the present embodiment, incoming current is current flowing into semiconductor chips 3. The dot-and-dash arrows show the direction in which outgoing current flows. In the present embodiment, outgoing current is current flowing out of semiconductor chips 3. The white arrows show the direction of force acting on semiconductor device 100.

As shown in FIG. 3, in the present embodiment, incoming current passes through first extension portion 212, first connection portion 211, first electrode 11, and each of semiconductor chips 3 in this order to flow from first extension portion 212 to each of semiconductor chips 3. As shown in FIG. 4, outgoing current passes through second electrode 12, second connection portion 221, and second extension portion 222 (see FIG. 3) in this order to flow from each of semiconductor chips 3 to second extension portion 222 (see FIG. 3).

As shown in FIG. 3, incoming current flows along the Y-axis positive direction from first extension portion 212 to first connection portion 211 of first bus bar 21. As shown in FIG. 4, incoming current flows along the Z-axis positive direction from first connection portion 211 to first electrode 11. Incoming current flows along the X-axis positive direction from first electrode 11 to each of semiconductor chips 3. Incoming current flows along the Z-axis negative direction from first surface $3u$ to second surface $3d$ of each of semiconductor chips 3.

As shown in FIG. 4, outgoing current flows along the X-axis positive direction from second electrode 12 to second connection portion 221. Outgoing current flows along the Z-axis positive direction from second electrode 12 to second connection portion 221. As shown in FIG. 3, outgoing current flows along the Y-axis negative direction from second connection portion 221 to second extension portion 222.

As shown in FIG. 3, in a normal state of semiconductor device 100, the direction of incoming current flowing through first electrode 11 is the same as the direction of outgoing current flowing through second electrode 12. Specifically, incoming current flowing through first electrode 11 and outgoing current flowing through second electrode 12 flow along the X-axis positive direction. Thus, production of electromagnetic repulsion in first electrode 11 and second electrode 12 is suppressed.

As shown in FIG. 3, when the direction in which first extension portion 212 extends from first connection portion 211 is the same as the direction in which second extension portion 222 extends from second connection portion 221, the direction of current flowing through first bus bar 21 is opposite to the direction of current flowing through second bus bar 22. In this case, electromagnetic repulsion is produced in first bus bar 21 and second bus bar 22.

<Current Flowing Through Semiconductor Device 100 Including Short-Circuited Semiconductor Chip 3 and Electromagnetic Repulsion Produced by Current>

Figure 5:
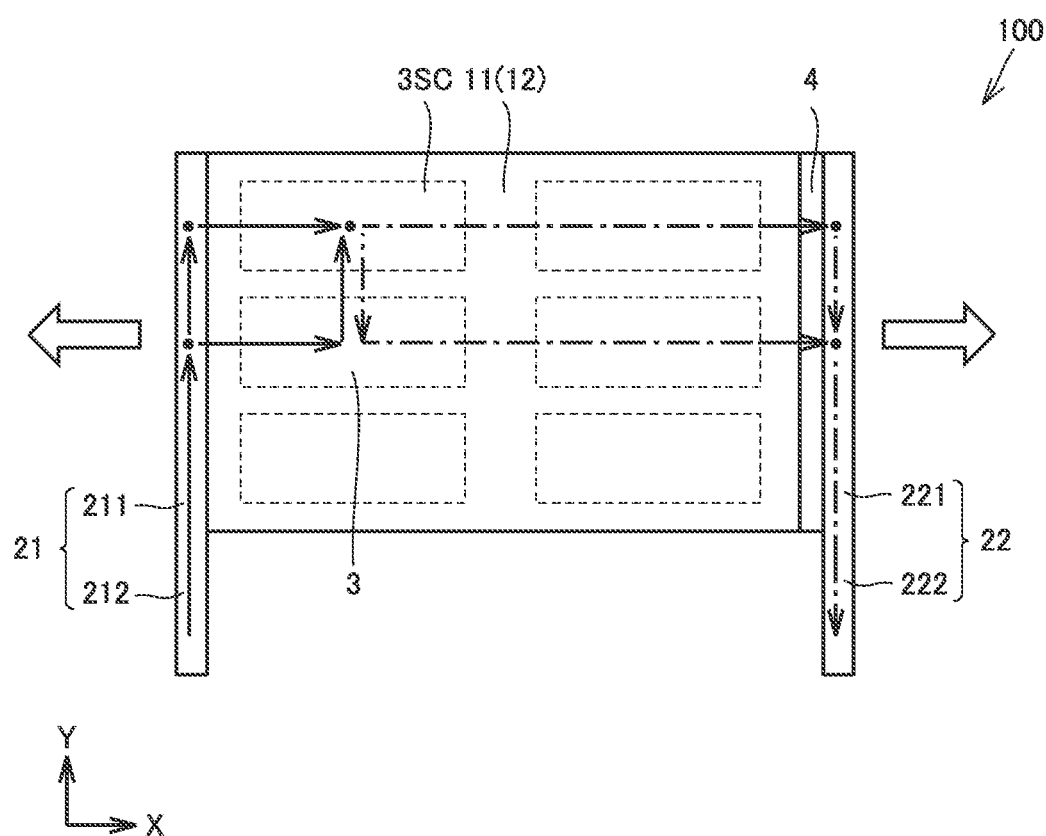
FIG. 5 is a top view schematically showing current flowing through the semiconductor device in a case where the semiconductor device according to the first embodiment includes a short-circuited semiconductor chip.

Referring now to FIG. 5, the direction in which current flows in a case where semiconductor chips 3 include a short-circuit semiconductor chip 3SC will be described. FIG. 5 is a top view corresponding to FIG. 3 and schematically shows current flowing through semiconductor device 100 when semiconductor device 100 according to the first embodiment includes short-circuit semiconductor chip 3SC that is short-circuited. The same description as the case where semiconductor device 100 is in a normal state will not be repeated.

Short-circuit semiconductor chip 3SC is short-circuited. Short-circuit semiconductor chip 3SC has a resistance smaller than normal semiconductor chip 3. Incoming current therefore is more likely to flow through short-circuit semiconductor chip 3SC than through normal semiconductor chip 3. Thus, in first electrode 11, incoming current is likely to flow toward short-circuit semiconductor chip 3SC. Incoming current therefore does not always flow along the X-axis direction in first electrode 11. Incoming current may flow into short-circuit semiconductor chip 3SC from the periphery of short-circuit semiconductor chip 3SC. For example, as shown in FIG. 5, incoming current flows into short-circuit semiconductor chip 3SC along the Y-axis positive direction. In second electrode 12, outgoing current does not always flow along the X axis. For example, as shown in FIG. 5, outgoing current flows out of short-circuit semiconductor chip 3SC along the Y-axis negative direction.

As shown in FIG. 5, in the present embodiment, when semiconductor chips 3 include short-circuit semiconductor chip 3SC, the direction of incoming current flowing through first electrode 11 may be the direction opposite to the direction of outgoing current flowing through second electrode 12. When the direction of incoming current flowing through first electrode 11 is the direction opposite to the direction of outgoing current flowing through second electrode 12, electromagnetic repulsion is produced in first electrode 11 and second electrode 12.

As shown in FIG. 5, in the present embodiment, the direction of electromagnetic repulsion produced in first electrode 11 is the Z-axis positive direction (the direction toward the front side of the drawing sheet). The direction of electromagnetic repulsion produced in second electrode 12 is the Z-axis negative direction (the direction toward the back side of the drawing sheet).

The direction in which first electrode 11 and second electrode 12 go away from semiconductor chips 3 due to the electromagnetic repulsion produced in first electrode 11 and second electrode 12 is the direction along the first direction (Z-axis direction). On the other hand, the direction of electromagnetic repulsion produced in first bus bar 21 and second bus bar 22 is the direction (second direction) intersecting the electromagnetic repulsion produced in first electrode 11 and second electrode 12. Therefore, the direction of the electromagnetic repulsion produced in first bus bar 21 and second bus bar 22 is different from the direction in which first electrode 11 and second electrode 12 go away from semiconductor chip 3.

When semiconductor chips 3 include short-circuit semiconductor chip 3SC, current larger than that of normal semiconductor chip 3 flows into short-circuit semiconductor chip 3SC. Thus, electromagnetic repulsion produced at portions of first electrode 11 and second electrode 12 in pressure contact with the short-circuited semiconductor chip 3 is larger than electromagnetic repulsion produced at portions of first electrode 11 and second electrode 12 in pressure contact with normal semiconductor chip 3.

<Semiconductor Device 100 According to Comparative Example>

Figure 6:
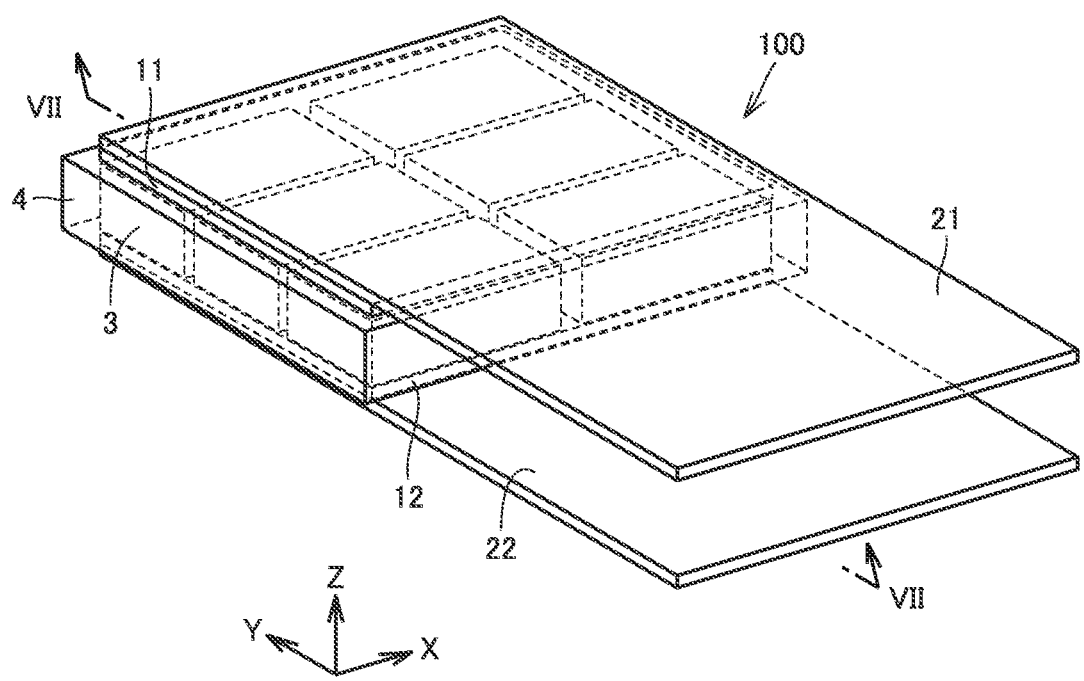
FIG. 6 is a perspective view schematically showing a configuration of a semiconductor device according to a comparative example.
Figure 7:
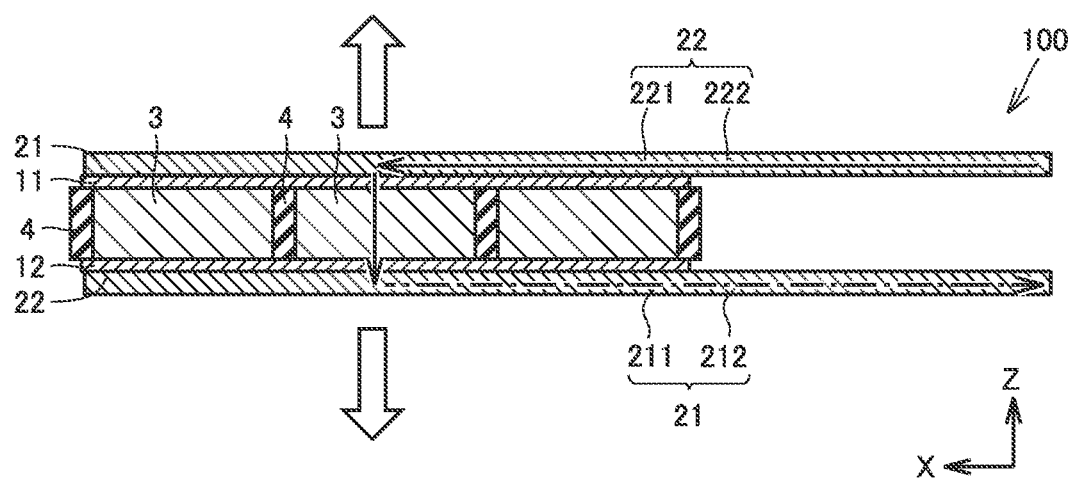
FIG. 7 is a cross-sectional view along line VII-VII in FIG. 6.

Referring now to FIG. 6 and FIG. 7, a configuration of semiconductor device 100 according to a comparative example will be described. As shown in FIG. 6, in semiconductor device 100 according to a comparative example, first bus bar 21 and second bus bar 22 sandwich first electrode 11, second electrode 12, a plurality of semiconductor chips 3, and insulating part 4 in the first direction (Z-axis direction). Semiconductor device 100 in the comparative example differs from semiconductor device 100 in the present embodiment in that first bus bar 21 and second bus bar 22 sandwich insulating part 4 in the first direction.

As shown in FIG. 7, first bus bar 21 in the comparative example is connected to first electrode 11 so as to overlap with first electrode 11. Second bus bar 22 is connected to second electrode 12 so as to overlap with second electrode 12. First bus bar 21 and second bus bar 22 therefore are not fixed to insulating part 4. First bus bar 21 is movable together with first electrode 11 in the first direction. Second bus bar 22 is movable together with second electrode 12 in the first direction. The direction in which first extension portion 212 in the comparative example extends is the same direction as the direction in which second extension portion 222 extends.

Referring now to FIG. 7, current flowing through semiconductor device 100 according to the comparative example and electromagnetic repulsion produced in semiconductor device 100 according to the comparative example will be described.

In the comparative example, the direction of current flowing through first bus bar 21 is the direction opposite to the direction of current flowing through second bus bar 22. Electromagnetic repulsion is therefore produced in first bus bar 21 and second bus bar 22. The direction of electromagnetic repulsion produced in first bus bar 21 is the same direction as the direction away from semiconductor chip 3 along the first direction. The direction of electromagnetic repulsion produced in second bus bar 22 is the same direction as the direction away from semiconductor chip 3 along the first direction.

As shown in FIG. 7, in semiconductor device 100 according to the comparative example, since first bus bar 21 is connected to first electrode 11 in an overlapping manner, electromagnetic repulsion produced in first bus bar 21 also acts on first electrode 11 in addition to first bus bar 21. Since second bus bar 22 is connected to second electrode 12 in an overlapping manner, electromagnetic repulsion produced in second bus bar 22 also acts on second electrode 12 in addition to second bus bar 22. Thus, a force in the direction away from semiconductor chip 3 along the first direction (Z axis) acts on first electrode 11 and second electrode 12. In a normal state of semiconductor device 100, electromagnetic repulsion produced in first bus bar 21 and second bus bar 22 acts on first electrode 11 and second electrode 12. Thus, first electrode 11 and second electrode 12 may separate from semiconductor chip 3.

When semiconductor chips 3 include short-circuited short-circuit semiconductor chip 3SC (see FIG. 5) in the comparative example, electromagnetic repulsion is produced in first electrode 11 and second electrode 12 along the first direction. Therefore, when semiconductor chips 3 include short-circuit semiconductor chip 3SC (see FIG. 5) in the comparative example, electromagnetic repulsion produced in first electrode 11 and second electrode 12 and electromagnetic repulsion produced in first bus bar 21 and second bus bar 22 act on first electrode 11 and second electrode 12. Accordingly, first electrode 11 and second electrode 12 in the case where semiconductor chips 3 include short-circuited short-circuit semiconductor chip 3SC (see FIG. 5) in the comparative example are more likely to separate from semiconductor chip 3 than in a normal state of semiconductor device 100.

Effect of First Embodiment

In the semiconductor according to the present embodiment, as shown in FIG. 2, second electrode 12 and first electrode 11 sandwich semiconductor chips 3 in the first direction (Z-axis direction). First bus bar 21 and second bus bar 22 sandwich insulating part 4 in the second direction (X-axis direction). The second direction (X-axis direction) is the direction intersecting the first direction (Z-axis direction). The direction of electromagnetic repulsion produced in first bus bar 21 and second bus bar 22 is therefore a direction different from the direction in which first electrode 11 and second electrode 12 go away from semiconductor chip 3. Thus, the force in the direction away from semiconductor chip 3 that acts on first electrode 11 and second electrode 12 due to electromagnetic repulsion produced in first bus bar 21 and second bus bar 22 can be reduced compared with when each of a pair of bus bars overlaps with the corresponding one of a pair of electrodes. Accordingly, separation of first electrode 11 and second electrode 12 in pressure contact with semiconductor chips 3 from semiconductor chips 3 can be suppressed.

Since separation of first electrode 11 and second electrode 12 in pressure contact with semiconductor chips 3 from semiconductor chips 3 can be suppressed, the force (stack force) for bringing first electrode 11 and second electrode 12 into pressure contact with semiconductor chips 3 can be reduced. Thus, there is no need for increasing the strength of semiconductor device 100 and therefore the design of semiconductor device 100 can be facilitated.

Supposing that first electrode 11 or second electrode 12 separates from semiconductor chip 3, a gap is produced between semiconductor chip 3 and first electrode 11 or second electrode 12. Since the resistance of the gap is larger than that of first electrode 11, second electrode 12, and semiconductor chip 3, current causes an arc in the gap. Thus, the temperature of semiconductor device 100 rises, possibly causing further inconvenience in semiconductor device 100.

In the present embodiment, since separation of first electrode 11 and second electrode 12 in pressure contact with semiconductor chips 3 from semiconductor chips 3 can be suppressed, any further inconvenience in semiconductor device 100 due to separation can be suppressed.

As shown in FIG. 1, since first electrode 11 and second electrode 12 are in pressure contact with semiconductor chips 3, first electrode 11 and second electrode 12 can move relative to each of semiconductor chips 3 along the first direction (Z-axis direction). Because of this, even when semiconductor chips 3 vary in dimension in the first direction (Z-axis direction), first electrode 11 and second electrode 12 can be electrically connected to semiconductor chips 3. Therefore, a permissible deviation in dimension of semiconductor chips 3 can be increased.

As shown in FIG. 1, since first bus bar 21 and second bus bar 22 are fixed to the insulator, separation of first bus bar 21 and second bus bar 22 from the insulator can be suppressed even when electromagnetic repulsion is produced in first bus bar 21 and second bus bar 22.

Second Embodiment

Figure 8:
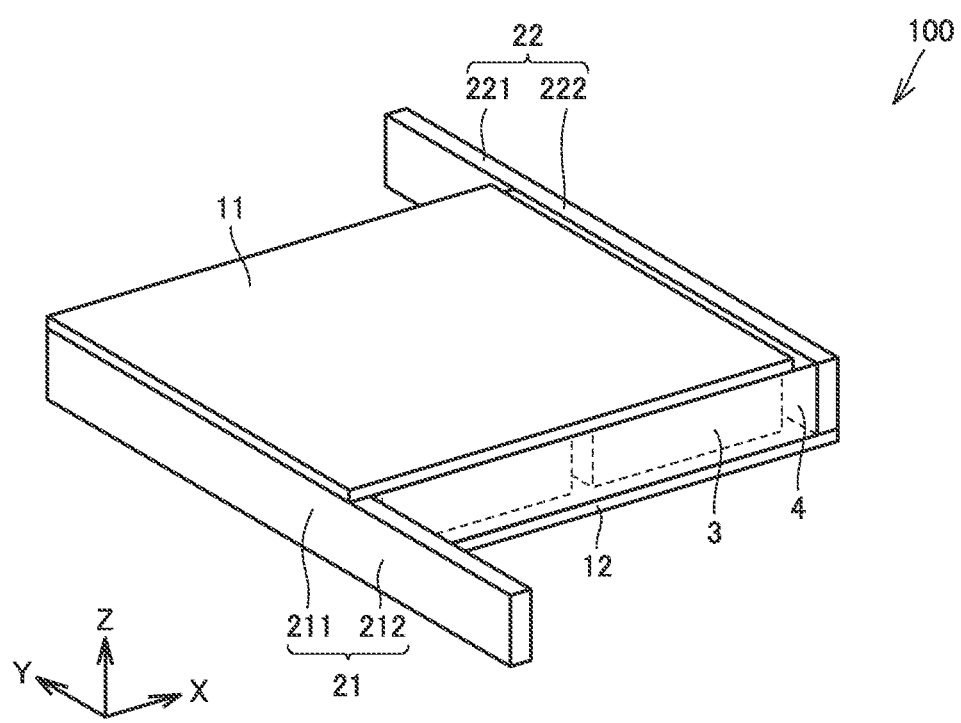
FIG. 8 is a perspective view schematically showing a configuration of a semiconductor device according to a second embodiment.

Referring to now to FIG. 8, a configuration of semiconductor device 100 according to a second embodiment will be described. The second embodiment has the same configuration and operation effect as the foregoing first embodiment unless otherwise specified. The same configuration as the foregoing first embodiment is denoted by the same reference sign and a description thereof will not be repeated.

As shown in FIG. 8, the direction in which first extension portion 212 extends is the direction opposite to the direction in which second extension portion 222 extends. First extension portion 212 according to the present embodiment extends along the Y-axis negative direction with respect to first connection portion 211. Second extension portion 222 extends along the Y-axis positive direction with respect to second connection portion 221. Thus, first extension portion 212 does not face second extension portion 222. First bus bar 21 faces second bus bar 22 only at first connection portion 211.

In semiconductor device 100 according to the present embodiment, since the direction in which first extension portion 212 extends is the direction opposite to the direction in which second extension portion 222 extends, first extension portion 212 does not face second extension portion 222. Thus, the area in which first bus bar 21 and second bus bar 22 face each other is smaller than when the direction in which first extension portion 212 extends is the same direction as the direction in which second extension portion 222 extends. Accordingly, the area in which applied current and outgoing current flow in opposite directions is smaller than when the direction in which first extension portion 212 extends is the same direction as the direction in which second extension portion 222 extends. Electromagnetic repulsion produced between first bus bar 21 and second bus bar 22 is therefore smaller than when the direction in which first extension portion 212 extends is the same direction as the direction in which second extension portion 222 extends. Thus, the force to fix first bus bar 21 and second bus bar 22 to insulating part 4 can be reduced. In addition, separation of first bus bar 21 and second bus bar 22 from insulating part 4 can be further suppressed.

Third Embodiment

Figure 9:
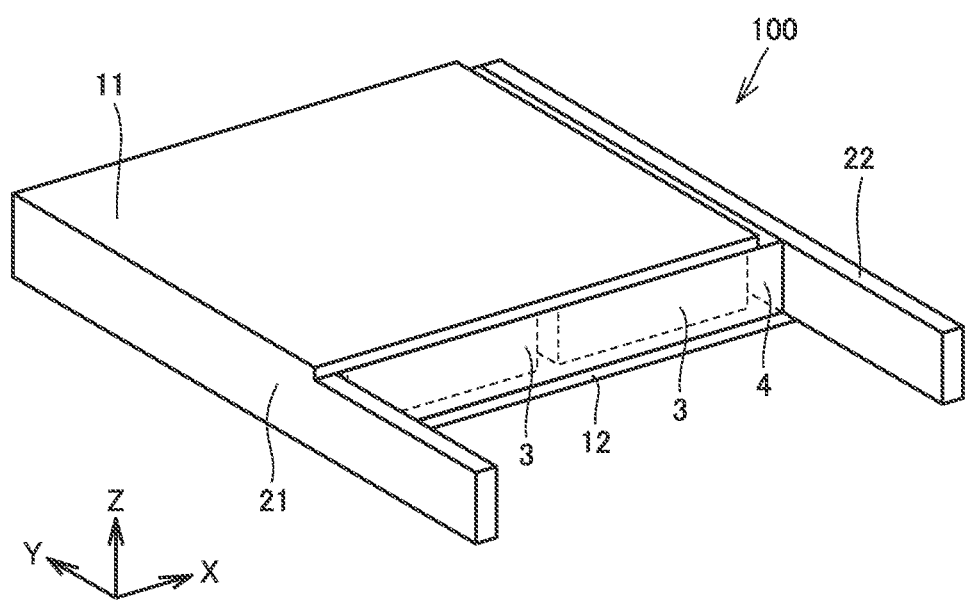
FIG. 9 is a perspective view schematically showing a configuration of a semiconductor device according to a third embodiment.

Referring to now to FIG. 9, a configuration of semiconductor device 100 according to a third embodiment will be described. The third embodiment has the same configuration and operation effect as the foregoing first embodiment unless otherwise specified. The same configuration as the foregoing first embodiment is denoted by the same reference sign and a description thereof will not be repeated.

As shown in FIG. 9, first bus bar 21 according to the present embodiment is formed integrally with first electrode 11. Second bus bar 22 is formed integrally with second electrode 12.

In semiconductor device 100 according to the present embodiment, for example, the integrated first bus bar 21 and first electrode 11 may be formed by bending a sheet of a plate-like member at right angle. For example, the integrated second bus bar 22 and second electrode 12 may be formed by bending a sheet of a plate-like member at right angle. For example, the integrated first bus bar 21 and first electrode 11 may be formed by welding first bus bar 21 to first electrode 11. For example, the integrated second bus bar 22 and second electrode 12 may be formed by welding second bus bar 22 to second electrode 12.

In a method of manufacturing semiconductor device 100 according to the present embodiment, first electrode 11 is brought into pressure contact with semiconductor chips 3 and thereafter first bus bar 21 is fixed to insulating part 4.

Second electrode 12 is brought into pressure contact with semiconductor chips 3 and thereafter second bus bar 22 is fixed to insulating part 4.

In semiconductor device 100 according to the present embodiment, since first bus bar 21 is formed integrally with first electrode 11 and second bus bar 22 is formed integrally with second electrode 12, the number of components of semiconductor device 100 can be reduced. The manufacturing cost of semiconductor device 100 therefore can be reduced. In addition, since the assembly of semiconductor device 100 is simplified, the manufacturing cost of semiconductor device 100 can be reduced.

Fourth Embodiment

Figure 10:
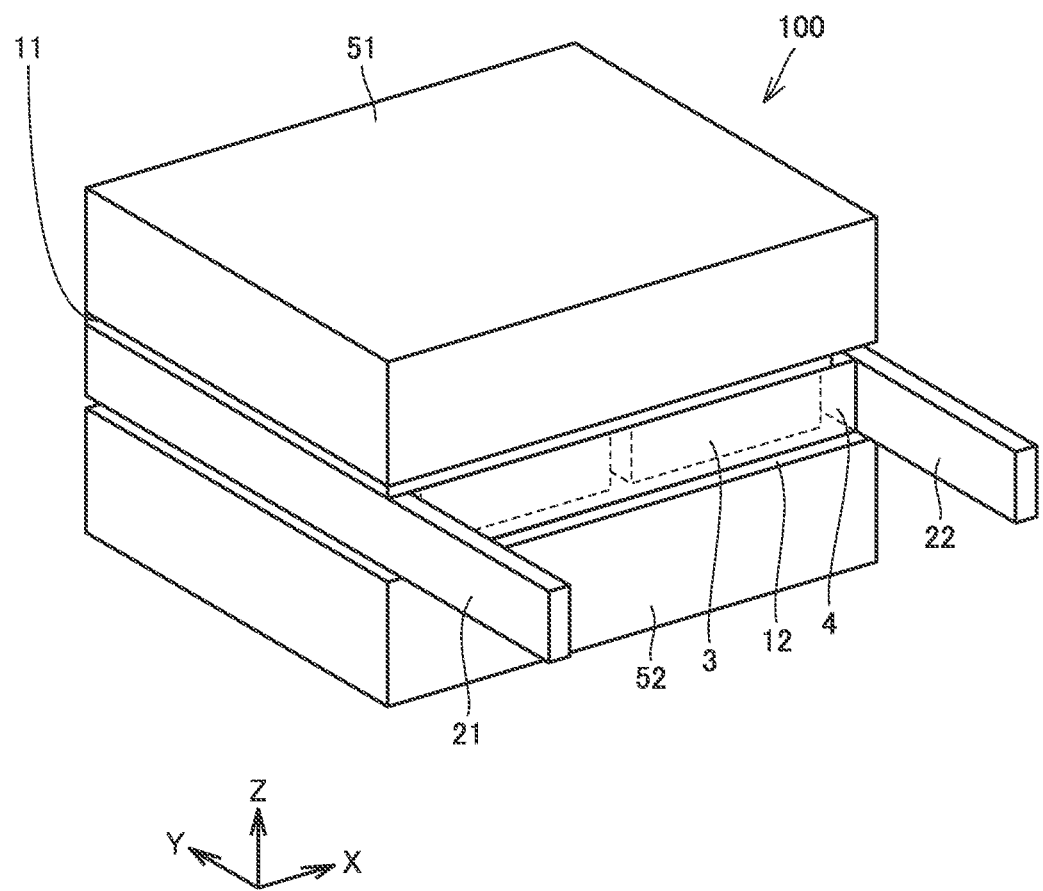
FIG. 10 is a perspective view schematically showing a configuration of a semiconductor device according to a fourth embodiment.
Figure 11:
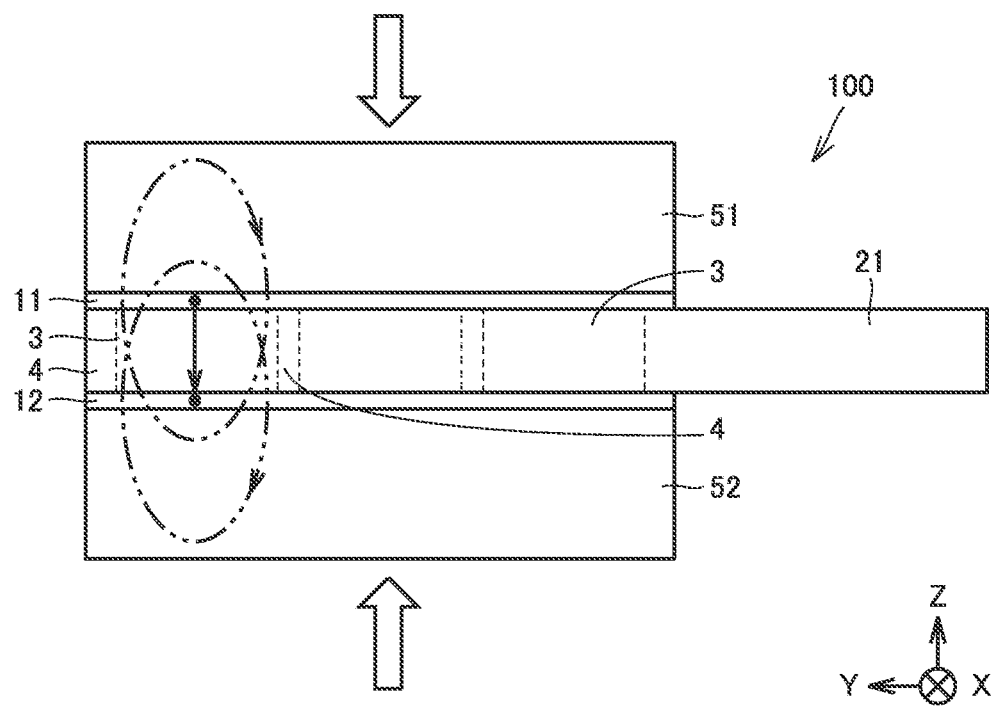
FIG. 11 is a side view schematically showing a configuration of the semiconductor device according to the fourth embodiment.

Referring to now to FIG. 10 and FIG. 11, a configuration of semiconductor device 100 according to a fourth embodiment will be described. FIG. 10 is a perspective view schematically showing a configuration of semiconductor device 100 according to the fourth embodiment. FIG. 11 is a side view schematically showing a configuration of semiconductor device 100 according to the fourth embodiment and schematically shows a magnetic field produced by current flowing through semiconductor device 100. The dashed-two dotted arrows show a magnetic field. The fourth embodiment has the same configuration and operation effect as the foregoing first embodiment unless otherwise specified. The same configuration as the foregoing first embodiment is denoted by the same reference sign and a description thereof will not be repeated.

As shown in FIG. 10, semiconductor device 100 according to the present embodiment further includes a first magnetic plate 51 and a second magnetic plate 52. First magnetic plate 51 is arranged on first electrode 11 on the side opposite to semiconductor chips 3. Second magnetic plate 52 is arranged on second electrode 12 on the side opposite to semiconductor chips 3. First magnetic plate 51 and second magnetic plate 52 are ferromagnets. First magnetic plate 51 and second magnetic plate 52 sandwich first electrode 11, second electrode 12, semiconductor chips 3, and insulating part 4 in the first direction (Z-axis direction). Semiconductor device 100 according to the present embodiment differs from semiconductor device 100 in the first embodiment in that it further includes first magnetic plate 51 and second magnetic plate 52.

As shown in FIG. 10, first magnetic plate 51 overlaps with first electrode 11. First magnetic plate 51 is shaped like a plate along first electrode 11. Second magnetic plate 52 overlaps with second electrode 12. Second magnetic plate 52 is shaped like a plate along second electrode 12.

As shown in FIG. 11, a magnetic field is produced by current flowing through first electrode 11 along the X-axis positive direction (toward the back side of the drawing sheet). A magnetic field is produced by current flowing through second electrode 12 along the X-axis positive direction (toward the back side of the drawing sheet). The direction of current flowing through first electrode 11 is the same direction as the direction of current flowing through second electrode 12. The direction of a magnetic field produced by current flowing through first electrode 11 is therefore the same direction as the direction of a magnetic field produced by current flowing through second electrode 12.

As shown in FIG. 11, the magnetic field produced by current flowing through first electrode 11 is transmitted through the inside of both of first magnetic plate 51 and second magnetic plate 52, and the magnetic field produced by current flowing through second electrode 12 is transmitted through the inside of both of first magnetic plate 51 and second magnetic plate 52. Since first magnetic plate 51 and second magnetic plate 52 are ferromagnets, the magnetic field transmitted through first magnetic plate 51 and second magnetic plate 52 produces electromagnetic attraction in first magnetic plate 51 and second magnetic plate 52. The direction of electromagnetic attraction produced in first magnetic plate 51 and second magnetic plate 52 is the direction toward semiconductor chip 3 along the first direction (Z-axis direction).

As shown in FIG. 11, first magnetic plate 51 overlaps with first electrode 11, and second magnetic plate 52 overlaps with second electrode 12. Therefore, the electromagnetic attraction produced in first magnetic plate 51 acts on first electrode 11, and the electromagnetic attraction produced in second magnetic plate 52 acts on second electrode 12. First magnetic plate 51, second magnetic plate 52, first electrode 11, and second electrode 12 overlap with semiconductor chips 3. Therefore, first electrode 11 is pushed against semiconductor chips 3 by the electromagnetic attraction produced in first magnetic plate 51, and second electrode 12 is pushed against semiconductor chips 3 by the electromagnetic attraction produced in second magnetic plate 52.

In semiconductor device 100 according to the present embodiment, semiconductor device 100 further includes first magnetic plate 51 and second magnetic plate 52. Since first magnetic plate 51 and second magnetic plate 52 are ferromagnets, electromagnetic attraction is produced in first magnetic plate 51 and second magnetic plate 52 when current in the same direction flows through first electrode 11 and second electrode 12. First electrode 11 and second electrode 12 can be pushed against semiconductor chip 3 by the electromagnetic attraction produced in first magnetic plate 51 and second magnetic plate 52. Thus, separation of first electrode 11 and second electrode 12 from semiconductor chips 3 can be suppressed.

Since first electrode 11 and second electrode 12 can be pushed against semiconductor chip 3 by first magnetic plate 51 and second magnetic plate 52, the force (stack force) to bring first electrode 11 and second electrode 12 into pressure contact with semiconductor chip 3 can be reduced. As a result, the design of semiconductor device 100 can be facilitated. For example, there is no need for increasing the strength of semiconductor device 100.

Fifth Embodiment

Referring to now to FIG. 12 to FIG. 15, a configuration of semiconductor device 100 according to a fifth embodiment will be described. The fifth embodiment has the same configuration and operation effect as the foregoing fourth embodiment unless otherwise specified. The same configuration as the foregoing fourth embodiment is denoted by the same reference sign and a description thereof will not be repeated.

Figure 12:
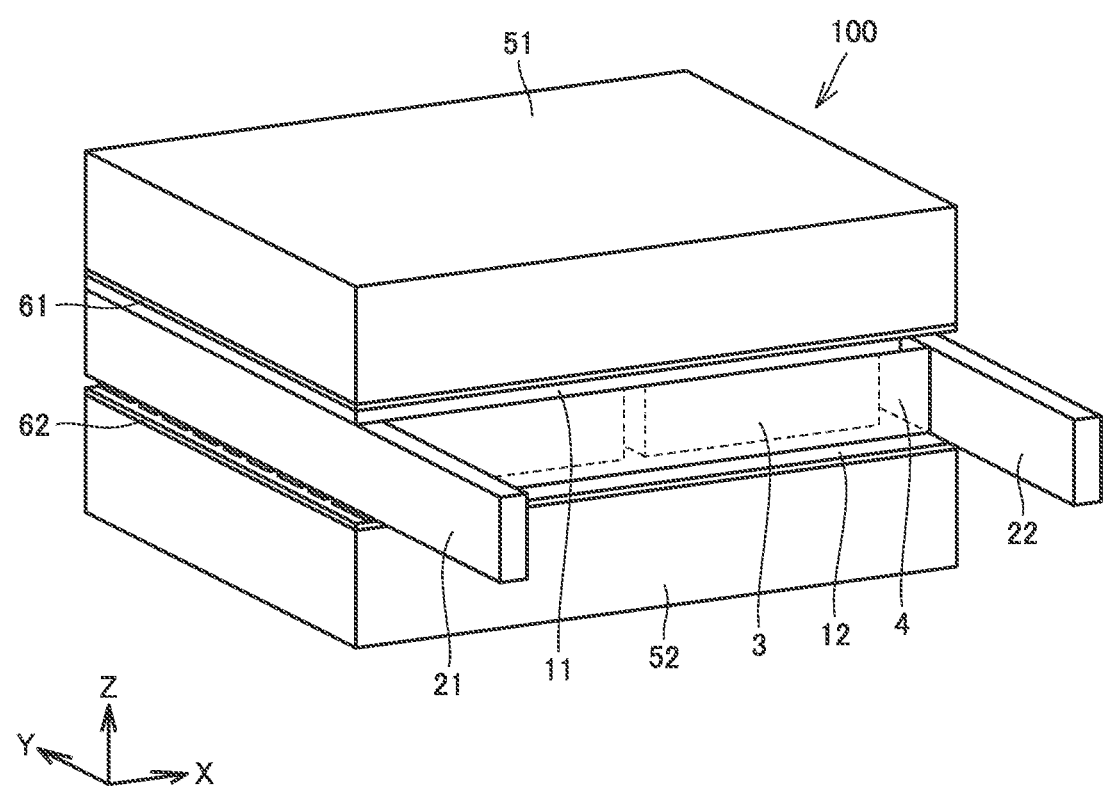
FIG. 12 is a perspective view schematically showing a configuration of a semiconductor device according to a fifth embodiment.

As shown in FIG. 12, semiconductor device 100 according to the present embodiment further includes a first insulating plate 61 and a second insulating plate 62. First insulating plate 61 is arranged between first electrode 11 and first magnetic plate 51. Second insulating plate 62 is arranged between second electrode 12 and second magnetic plate 52. First insulating plate 61 and second insulating plate 62 are insulators. First magnetic plate 51 is insulated from first electrode 11 by first insulating plate 61. Second magnetic plate 52 is insulated from second electrode 12 by second insulating plate 62.

Figure 13:
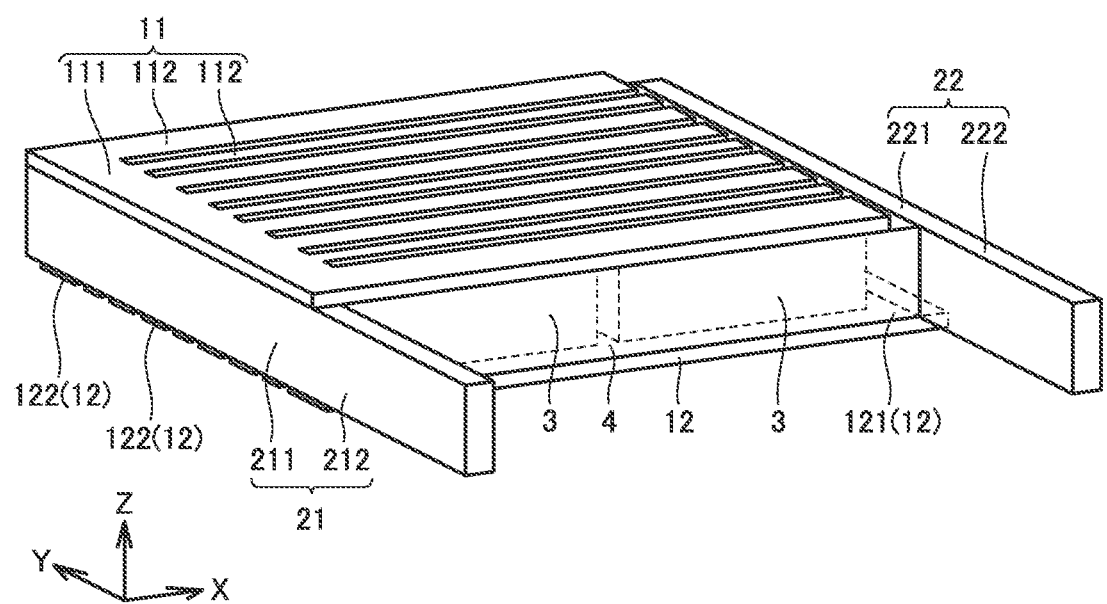
FIG. 13 is a perspective view schematically showing a configuration of a first electrode, a second electrode, a plurality of semiconductor chips, an insulating part, a first bus bar, and a second bus bar according to the fifth embodiment.

As shown in FIG. 13, first electrode 11 according to the present embodiment includes a first base portion 111 and a plurality of first protruding portions 112. First base portion 111 is connected to first bus bar 21. First protruding portions 112 protrude from first base portion 111 in the second direction (X-axis direction).

Figure 14:
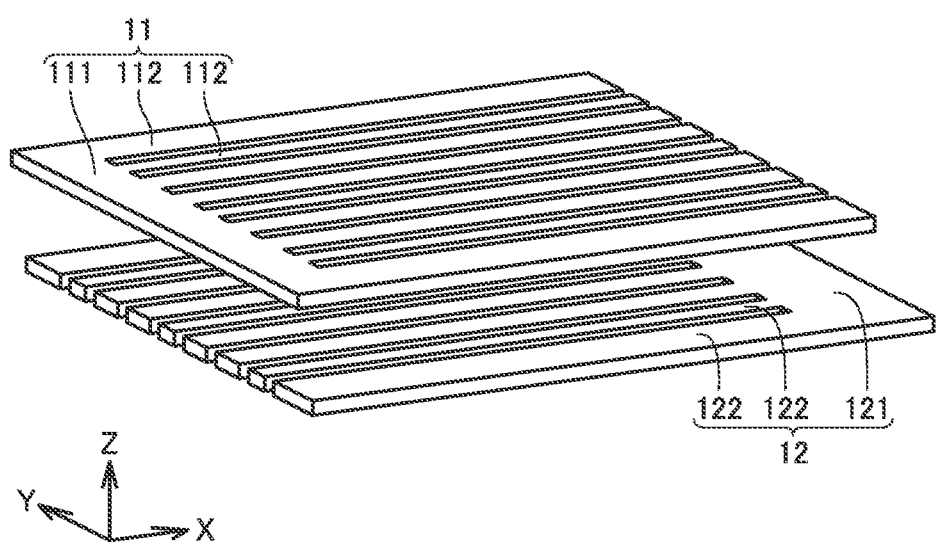
FIG. 14 is a perspective view schematically showing a configuration of the first electrode and the second electrode according to the fifth embodiment.

As shown in FIG. 14, second electrode 12 according to the present embodiment includes a second base portion 121 and a plurality of second protruding portions 122. As shown in FIG. 13, second base portion 121 is connected to second bus bar 22. Second protruding portions 122 protrude from second base portion 121 in the second direction (X-axis direction).

In the present embodiment, incoming current flows from first base portion 111 to semiconductor chips 3 along each of first protruding portions 112. As shown in FIG. 12, semiconductor chips 3 are arranged between each of first protruding portions 112 and each of second protruding portions 122. Thus, incoming current flows from each of first protruding portions 112 to each of second protruding portions 122 through semiconductor chips 3. Outgoing current flows from semiconductor chips 3 to second base portion 121 along each of second protruding portions 122.

Figure 15:
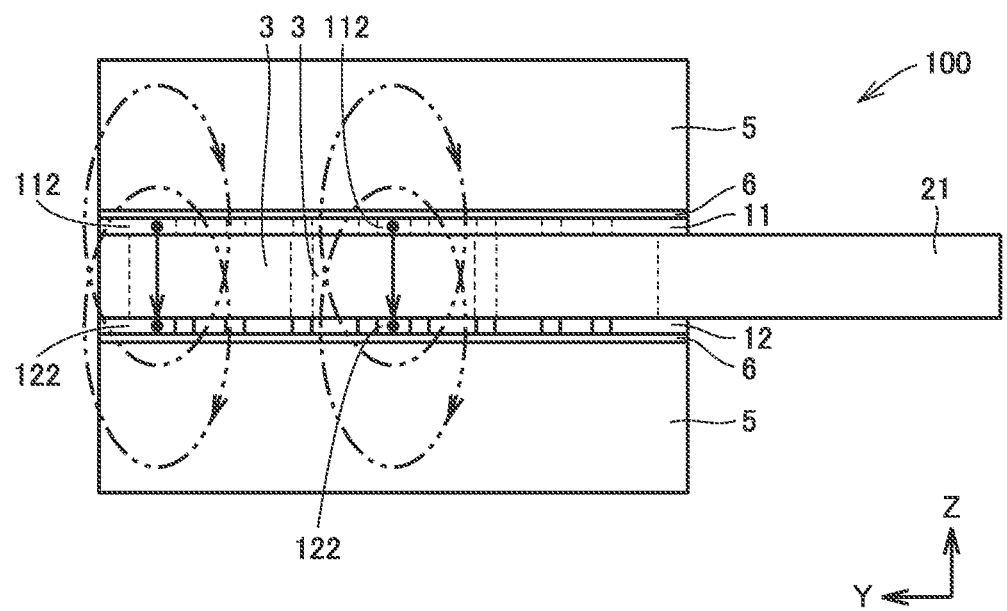
FIG. 15 is a side view schematically showing a configuration of the semiconductor device according to the fifth embodiment.

As shown in FIG. 15, magnetic flux is produced by incoming current flowing through each of first protruding portions 112 and outgoing current flowing through each of second protruding portions 122.

As shown in FIG. 13, first protruding portions 112 are spaced apart from each other. Second protruding portions 122 are spaced apart from each other.

In the semiconductor according to the present embodiment, first electrode 11 includes a plurality of first protruding portions 112 protruding from first base portion 111 in the second direction (X-axis direction), and second electrode 12 includes a plurality of second protruding portions 122 protruding from second base portion 121 in the second direction (X-axis direction). Thus, incoming current flows along the second direction (X-axis direction) reliably, and outgoing current flows along the second direction (X-axis direction) reliably. Thus, the direction in which incoming current flows is the same direction as the direction in which outgoing current flows. Accordingly, production of electromagnetic repulsion in first electrode 11 and second electrode 12 can be suppressed.

Since first protruding portions 112 are spaced apart from each other, incoming current flowing through one first protruding portion 112 of first protruding portions 112 is prevented from flowing through another first protruding portion 112 of first protruding portions 112. Thus, even when semiconductor chips 3 include short-circuit semiconductor chip 3SC, flowing of incoming current through short-circuit semiconductor chip 3SC in a concentrated manner can be suppressed. Furthermore, since second protruding portions 122 are spaced apart from each other, outgoing current flowing through one second protruding portion 122 of second protruding portions 122 is prevented from flowing through another second protruding portion 122 of second protruding portions 122. Thus, even when semiconductor chips 3 include short-circuit semiconductor chip 3SC, flowing of outgoing current from short-circuit semiconductor chip 3SC in a distributed manner can be suppressed. Therefore, even when semiconductor chips 3 include short-circuit semiconductor chip 3SC, production of electromagnetic repulsion in first electrode 11 and second electrode 12 can be suppressed.

Since semiconductor device 100 further includes first insulating plate 61, flowing of incoming current through first magnetic plate 51 can be suppressed. Thus, incoming current flows along first protruding portions 112. Furthermore, since semiconductor device 100 further includes second insulating plate 62, flowing of outgoing current through second magnetic plate 52 can be suppressed. Thus, outgoing current flows along second protruding portions 122. Therefore, the direction of current is aligned in the direction in which first protruding portion 112 and second protruding portion 122 protrude (X-axis direction), so that magnetic flux produced by current increases. Thus, electromagnetic attraction produced in first magnetic plate 51 and second magnetic plate 52 can be increased, so that separation of first electrode 11 and second electrode 12 from semiconductor chip 3 can be further suppressed.

Sixth Embodiment

Figure 16:
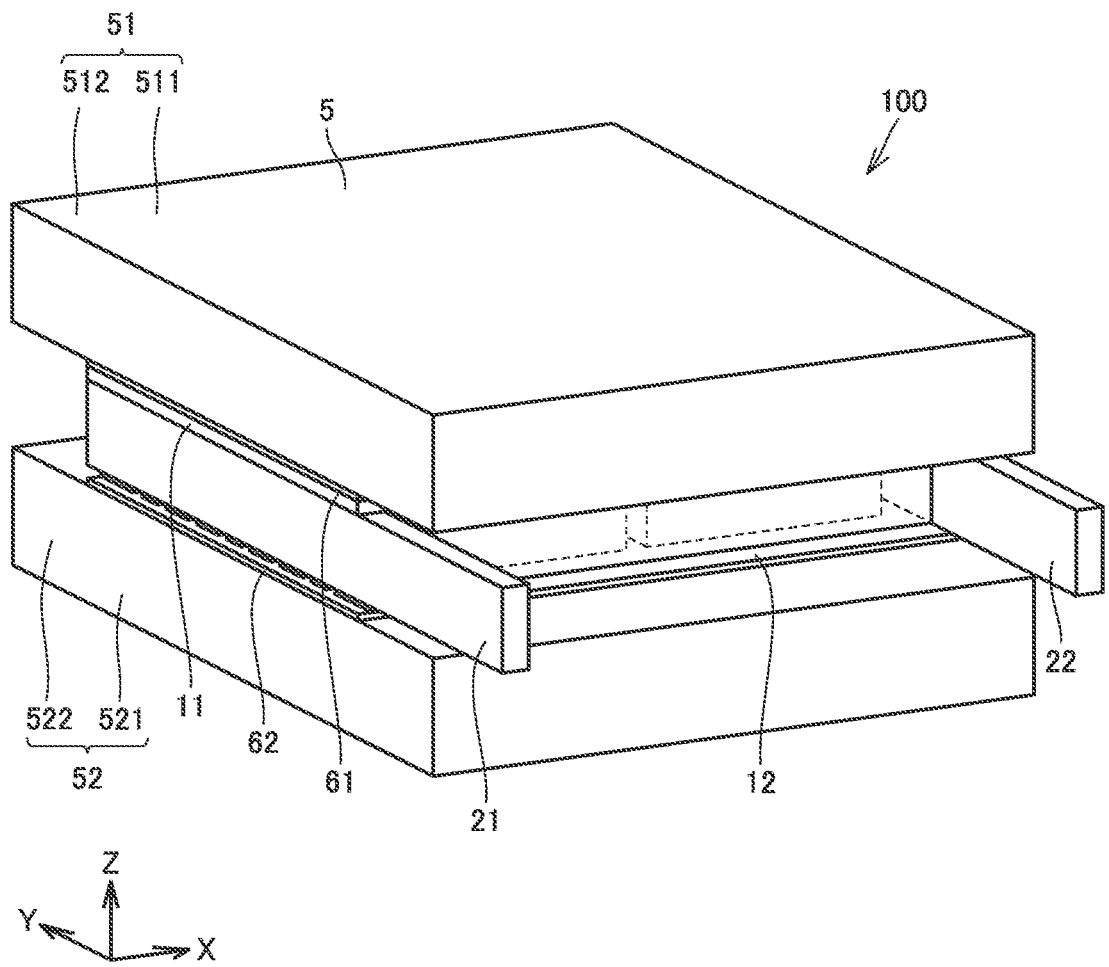
FIG. 16 is a perspective view schematically showing a configuration of a semiconductor device according to a sixth embodiment.
Figure 17:
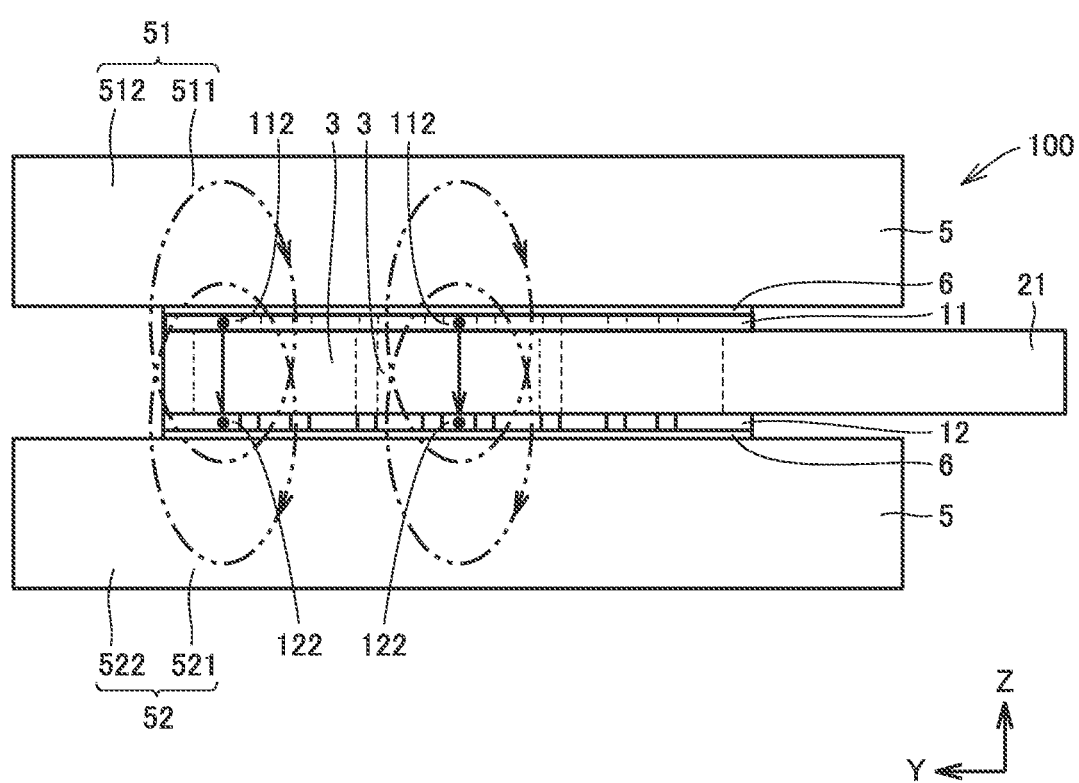
FIG. 17 is a side view schematically showing a configuration of the semiconductor device according to the sixth embodiment.

Referring to now to FIG. 16 and FIG. 17, a configuration of semiconductor device 100 according to a sixth embodiment will be described. FIG. 16 is a perspective view schematically showing a configuration of semiconductor device 100 according to the sixth embodiment. FIG. 17 is a side view schematically showing a configuration of semiconductor device 100 according to the sixth embodiment. FIG. 17 schematically shows a magnetic field produced by current flowing through semiconductor device 100. The sixth embodiment has the same configuration and operation effect as the foregoing fifth embodiment unless otherwise specified. The same configuration as the foregoing fifth embodiment is denoted by the same reference sign and a description thereof will not be repeated.

As shown in FIG. 16, first magnetic plate 51 according to the present embodiment includes a first body 511 and a first projecting portion 512. First body 511 overlaps with first electrode 11. First projecting portion 512 projects toward the outside of first electrode 11 along first electrode 11. First projecting portion 512 projects from first body 511 in the in-plane direction of first body 511. First projecting portion 512 projects from first body 511 along the Y-axis direction in the X-Y plane. First projecting portion 512 may project from first body 511 only in the Y-axis positive direction. First projecting portion 512 may project from first body 511 only in the Y-axis negative direction. First projecting portion 512 may project from first body 511 in the Y-axis positive direction and the Y-axis negative direction. First projecting portion 512 may project from first body 511 along the X axis in the X-Y plane.

As shown in FIG. 16, second magnetic plate 52 according to the present embodiment includes a second body 521 and a second projecting portion 522. Second body 521 overlaps with second electrode 12. Second projecting portion 522 projects toward the outside of second electrode 12 along second electrode 12. Second projecting portion 522 projects from second body 521 in the in-plane direction of second body 521. Second projecting portion 522 projects from second body 521 along the Y-axis direction in the X-Y plane. Second projecting portion 522 may project from second body 521 only in the Y-axis positive direction. Second projecting portion 522 may project from second body 521 only in the Y-axis negative direction. Second projecting portion 522 may project from second body 521 in the Y-axis positive direction and the Y-axis negative direction. Second projecting portion 522 may project from second body 521 along the X axis in the X-Y plane.

As shown in FIG. 15, in the fifth embodiment, there is a possibility that part of the magnetic flux produced by incoming current flowing through first electrode 11 and outgoing current flowing through second electrode 12 is not transmitted through first magnetic plate 51 and second magnetic plate 52. For example, there is a possibility that the magnetic flux produced by incoming current flowing through first protruding portion 112 arranged at an end of first electrode 11 is not transmitted through first magnetic plate 51 and second magnetic plate 52. For example, there is a possibility that the magnetic flux produced by outgoing current flowing through second protruding portion 122 arranged at an end of second electrode 12 is not transmitted through first magnetic plate 51 and second magnetic plate 52. Furthermore, there is a possibility that part of the magnetic flux produced by current flowing through first electrode 11 and second electrode 12 is not transmitted through first magnetic plate 51 and second magnetic plate 52, for example, when semiconductor chip 3 arranged at an end of a plurality of semiconductor chips 3 is short-circuited.

The electromagnetic attraction in the case where part of the magnetic flux produced by incoming current flowing through first electrode 11 is not transmitted through first magnetic plate 51 and second magnetic plate 52 is smaller than the electromagnetic attraction in the case where all of the magnetic flux produced by incoming current flowing through first electrode 11 is transmitted through first magnetic plate 51 and second magnetic plate 52. The electromagnetic attraction in the case where part of the magnetic flux produced by outgoing current flowing through second electrode 12 is not transmitted through first magnetic plate 51 and second magnetic plate 52 is smaller than the electromagnetic attraction in the case where all of the magnetic flux produced by outgoing current flowing through second electrode 12 is transmitted through first magnetic plate 51 and second magnetic plate 52.

In first magnetic plate 51 according to the present embodiment, as shown in FIG. 17, first magnetic plate 51 includes first projecting portion 512 and second magnetic plate 52 includes second projecting portion 522. First projecting portion 512 projects toward the outside of first electrode 11 along first electrode 11, and second projecting portion 522 projects toward the outside of second electrode 12 along second electrode 12. Thus, the magnetic flux produced by current flowing through first protruding portion 112 and second protruding portion 122 can be transmitted through first projecting portion 512 and second projecting portion 522. Thus, reduction of electromagnetic attraction produced in first magnetic plate 51 and second magnetic plate 52 can be suppressed.

Seventh Embodiment

Figure 18:
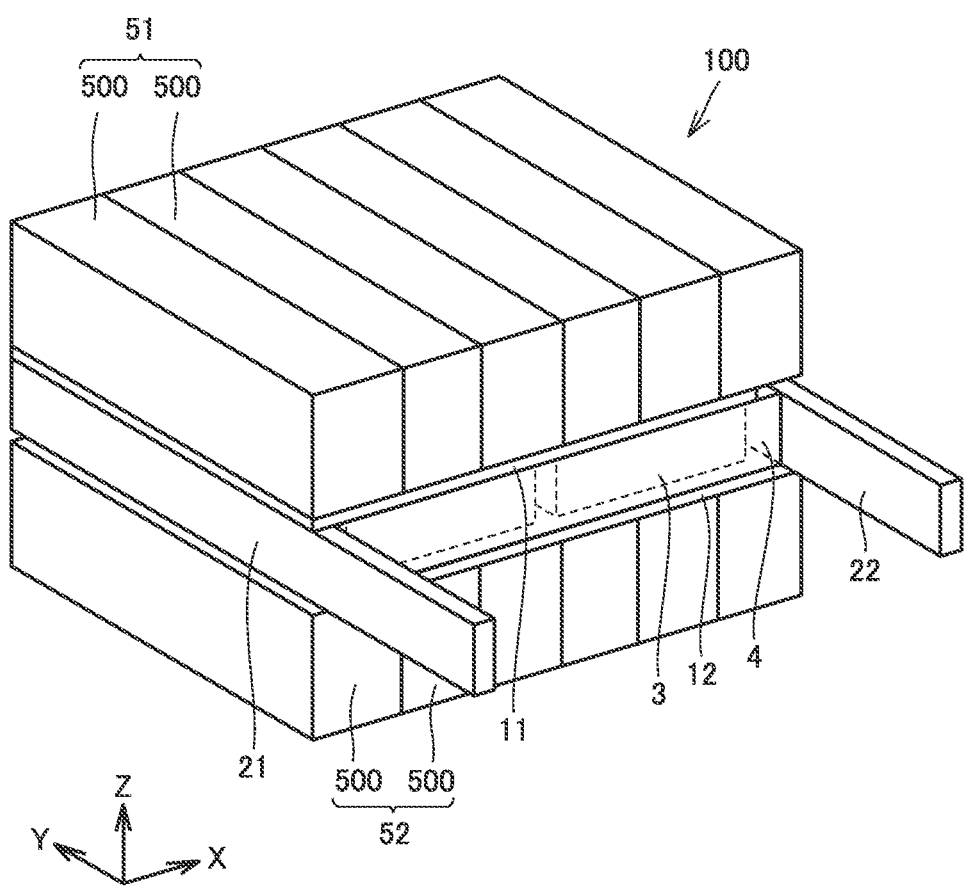
FIG. 18 is a perspective view schematically showing a configuration of a semiconductor device according to a seventh embodiment.

Referring to now to FIG. 18, a configuration of semiconductor device 100 according to a seventh embodiment will be described. FIG. 18 is a perspective view schematically showing a configuration of semiconductor device 100 according to the seventh embodiment. The seventh embodiment has the same configuration and operation effect as the foregoing fourth embodiment unless otherwise specified. The same configuration as the foregoing fourth embodiment is denoted by the same reference sign and a description thereof will not be repeated.

As shown in FIG. 18, first magnetic plate 51 and second magnetic plate 52 according to the present embodiment are formed of a plurality of electrical steel sheets 500. Electrical steel sheets 500 are stacked in the second direction (X-axis direction). Each of electrical steel sheets 500 includes a not-shown ferromagnet and a not-shown insulating film. The not-shown insulating film covers the not-shown ferromagnet.

Figure 19:
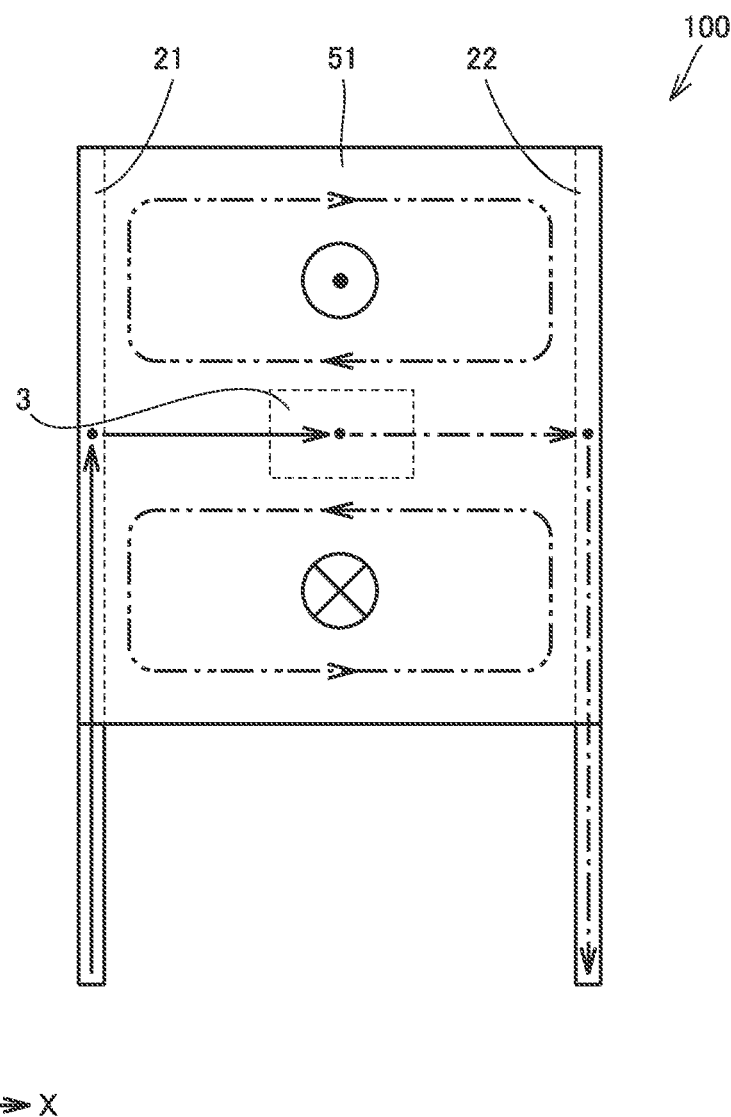
FIG. 19 is a top view schematically showing a configuration of the semiconductor device according to the fifth embodiment.

FIG. 19 is a top view schematically showing a configuration of semiconductor device 100 according to the fifth embodiment. FIG. 19 schematically shows a magnetic field produced by current flowing through semiconductor device 100 and eddy current produced by the magnetic field. The dashed-two dotted arrows show a direction in which eddy current flows. In the fifth embodiment, a magnetic field is produced by current flowing along the X-axis positive direction. In the fifth embodiment, eddy current is produced by a magnetic field by current flowing along the X-axis positive direction. The eddy current includes eddy current flowing in the X-axis direction and eddy current flowing in the Y-axis direction. In the fifth embodiment, first magnetic plate 51 and second magnetic plate 52 may heat due to the eddy current.

In semiconductor device 100 according to the present embodiment, as shown in FIG. 18, first magnetic plate 51 and second magnetic plate 52 are formed of a plurality of electrical steel sheets 500. Since electrical steel sheets 500 are stacked in the second direction (X-axis direction), the not-shown insulating films of electrical steel sheets 500 are also stacked in the second direction (X-axis direction). Thus, flowing of eddy current in the second direction (X-axis direction) can be suppressed. Accordingly, heating of first magnetic plate 51 and second magnetic plate 52 due to the eddy current can be suppressed.

Embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 3 semiconductor chip, 4 insulating part, 11 first electrode, 12 second electrode, 21 first bus bar, 22 second bus bar, 51 first magnetic body, 52 second magnetic body, 61 first insulating plate, 62 second insulating plate, 100 semiconductor device, 111 first base portion, 112 first protruding portion, 121 second base portion, 122 second protruding portion, 211 first connection portion, 212 first extension portion, 221 second connection portion, 222 second extension portion, 500 electrical steel sheet, 511 first body, 512 first projecting portion, 521 second body, 522 second projecting portion.

The invention claimed is:
1. A semiconductor device comprising:
a plurality of semiconductor chips;
an insulating part surrounding the semiconductor chips;
a first electrode in pressure contact with the semiconductor chips;
a second electrode in pressure contact with the semiconductor chips, the semiconductor chips being sandwiched between the first electrode and the second electrode in a first direction;
a first bus bar connected to the first electrode; and
a second bus bar connected to the second electrode,
wherein the first bus bar and the second bus bar sandwich the insulating part in a second direction intersecting the first direction.
2. The semiconductor device according to claim 1, wherein the first bus bar includes a first connection portion connected to the first electrode and a first extension portion extending from the first connection portion, the second bus bar includes a second connection portion connected to the second electrode and a second extension portion extending from the second connection portion, and a direction in which the first extension portion extends is a direction opposite to a direction in which the second extension portion extends.

3. The semiconductor device according to claim 1, wherein the first bus bar is formed integrally with the first electrode, and the second bus bar is formed integrally with the second electrode.

4. The semiconductor device according to claim 1, further comprising:

a first magnetic plate arranged on the first electrode on a side opposite to the semiconductor chips; and a second magnetic plate arranged on the second electrode on a side opposite to the semiconductor chips, wherein the first magnetic plate and the second magnetic plate are ferromagnets.

5. The semiconductor device according to claim 4, further comprising:

a first insulating plate arranged between the first electrode and the first magnetic plate;

a second insulating plate arranged between the second electrode and the second magnetic plate, wherein the first insulating plate and the second insulating plate are insulators, the first electrode includes a first base portion connected to the first bus bar and a plurality of first protruding portions protruding from the first base portion in the second direction, the second electrode includes a second base portion connected to the second bus bar and a plurality of second protruding portions protruding from the second base portion in the second direction, the semiconductor chips are arranged between each of the first protruding portions and each of the second protruding portions, the first protruding portions are spaced apart from each other, and the second protruding portions are spaced apart from each other.

6. The semiconductor device according to claim 4, wherein the first magnetic plate includes a first body overlapping with the first electrode and a first projecting portion projecting from the first body, the second magnetic plate includes a second body overlapping with the second electrode and a second projecting portion projecting from the second body, the first projecting portion projects toward outside of the first electrode along the first electrode, and the second projecting portion projects toward outside of the second electrode along the second electrode.

7. The semiconductor device according to claim 4, wherein the first magnetic plate and the second magnetic plate are formed of a plurality of electrical steel sheets, and the electrical steel sheets are stacked in the second direction.

* * * * *